United States Patent
Usoskin et al.

(10) Patent No.: US 6,541,121 B2
(45) Date of Patent: Apr. 1, 2003

(54) SUPERCONDUCTING ELEMENT

(75) Inventors: Alexander Usoskin, Goettingen (DE); Herbert Freyhardt, Goettingen (DE); Friedrich Harten, Stadthagen (DE)

(73) Assignees: Zentrum fuer Funktionswerkstoffe Gemeinnuetzige Gesellschaft mbH, Goettingen (DE); Alcatel Kabel AG & Co., Hannover (DE)

( * ) Notice: Subject to any disclaimer, the term of this patent is extended or adjusted under 35 U.S.C. 154(b) by 41 days.

(21) Appl. No.: 09/773,795

(22) Filed: Feb. 1, 2001

(65) Prior Publication Data

US 2002/0110708 A1 Aug. 15, 2002

(30) Foreign Application Priority Data

Feb. 1, 2000 (EP) .............................. 00101932

(51) Int. Cl.$^7$ ............................. B32B 9/00; H01L 39/00; H01B 12/00
(52) U.S. Cl. ....................... 428/469; 428/699; 428/701; 505/230
(58) Field of Search ................................ 428/469, 697, 428/698, 699, 700, 701, 930; 505/239, 230, 237, 704, 812, 813

(56) References Cited

U.S. PATENT DOCUMENTS

| | | | | |
|---|---|---|---|---|
| 4,787,827 A | * | 11/1988 | Hiraga et al. | 420/47 |
| 5,081,075 A | * | 1/1992 | Jin et al. | 252/514 |
| 5,102,865 A | * | 4/1992 | Woolf et al. | 428/209 |
| 5,168,127 A | * | 12/1992 | Kohno et al. | 174/125.1 |
| 5,236,894 A | * | 8/1993 | Tanaka et al. | 204/192.24 |
| 5,319,843 A | * | 6/1994 | Primdahl Iversen et al. | 29/599 |
| 5,739,086 A | * | 4/1998 | Goyal et al. | 117/101 |
| 5,872,080 A | * | 2/1999 | Arendt et al. | 428/469 |
| 5,968,877 A | * | 10/1999 | Budai et al. | 117/86 |
| 6,337,307 B1 | * | 1/2002 | Nakahara et al. | 174/125.1 |

FOREIGN PATENT DOCUMENTS

| | | |
|---|---|---|
| EP | 0 312 015 A2 | 4/1989 |
| EP | 0 441 724 A2 | 8/1991 |
| EP | 0 447 198 A2 | 9/1991 |
| JP | 05-078124 | 3/1993 |
| JP | 07011392 A * | 1/1995 |
| JP | 07109550 A * | 4/1995 |
| JP | 07310144 A * | 11/1995 |
| JP | 08269547 A * | 10/1996 |
| JP | 11071655 A * | 3/1999 |

OTHER PUBLICATIONS

XP–002140176, C. W. Wegst: "Stahlschlüssel" 1989, Verlag Stahlschluessel Wegst, 15$^{th}$ Edition, Marbach, Germany, L: Steel composition, pp. 350–351.

Patent Abstracts of Japan, Publication No. 05 078124, dated Mar. 30, 1993, vol. 017, No. 400 (C–1089), Jul. 27, 1993, Nisshin Steel Co. Ltd., Copyright 1993.

XP–002140177, Lampman S. R. et al., "Metals Handbook. Properties and Selection: Irons, Steels, and High–Performance Alloys" 1990, ASM, 10$^{th}$ Edition, vol. 1, Materials Park, OH, US, "Austenitic stainless steels," pp. 842–843.

XP 000323095, Minami N. et al., "Preparation of $YBa_2Cu_3O_{7-\delta}$ Superconductor Coating on Austenitic Steel by Electrophoretic Deposition Method—Study on Buffering Layers," Japanese Journal of Applied Physics, Part 2 (letters), vol. 31, No. 6B (Jun. 15, 1992), pp. 784–786.

Garcia–Moreno, Usoskin, Freyhardt et al., "High critical currents densities in YBCO films on technical substrates," Inst. Phys. Conf. Ser. No. 158, IOP Publishing Ltd. 1997, pp. 909–912.

Kinder et al., "Double Sided YBCO Films on 4" Substrates by Thermal Reactive Evaporation, IEEE Transactions on Applied Superconductivity, vol. 5, No. 2, Jun. 1995, pp. 1575–1580.

Quinton et al., "Fabrication of High Temperature, High Critical Current Density, Superconducting Tapes by Pulsed Laser Deposition," High Temperature Superconductivity, Research Review 1998, ed. W.Y. Liang, (University of Cambridge, 1998), pp. 135–141.

Iijima et al., "Structural and transport properties of biaxially aligned $YBa_2Cu_3O_7$_x films on polycrystalline Ni–based alloy with ion–beam–modified buffer layers," J. Appl. Phys., vol. 74, No. 3, American Institute of Physics (Aug. 1, 1993), pp. 1905–1910.

Goyal et al., "High critical density superconducting tapes by epitaxial deposition of $YBa_2Cu_3Ox$ thick films on biaxially textured metals," Appl. Phys. Letter, vol. 69, No. 12, American Institute of Physics (Sep. 16, 1996), pp. 1795–1797.

Hasegawa et al., "1998 International Workshop on Superconductivity," Program and Extended Abstracts, pp. 73–76.

* cited by examiner

Primary Examiner—Tom Dunn
Assistant Examiner—Colleen P. Cooke
(74) Attorney, Agent, or Firm—Husch & Eppenberger, LLC; Robert E. Muir

(57) ABSTRACT

A superconducting element comprising a high temperature superconducting film deposited on a stainless steel substrate that includes a composition of nickel; chromium; silicon; manganese; and iron. Optionally, carbon; phosphorous; sulfur; nitrogen; and unavoidable impurities will be present.

11 Claims, 1 Drawing Sheet

SUPERCONDUCTING ELEMENT

BACKGROUND OF THE INVENTION

The present invention relates generally to superconducting elements and more particularly to a superconducting element having a high temperature superconducting film deposited on a technical substrate which consists of stainless steel containing Ni, Cr, and Fe and other alloying elements, especially Mn and Si.

The recent progress in the technology of high temperature superconducting (HTSC) films demonstrates the first real possibility of obtaining high critical temperature ($T_c$) superconducting layers with high critical current densities ($j_c$) of >4 MA/cm$^2$ on various single crystalline substrates. Several methods based on pulsed laser deposition, molecular beam deposition, sputtering, etc. were developed and successfully applied for this purpose.

A crucial point in these developments is choosing an appropriate substrate material which can be manufactured in larger pieces (from 1 to 100 m) and which is not as expensive as single crystals. Thus, several attempts have been made to employ a number of different "technical" materials, such as Ni (Garcia-Moreno Usoskin, Freyhardt et al., IOP Conf. Ser. 158 (1997) 909–912), Yttrium Stabilised Zirconia (YSZ) ceramics (Kinder et al. IEEE Trans. on Appl. Superconductivity, Vol. 5 No. 2 (1995) 1575–1580), Hastelloy® (Quiton et al. in High Temperature Superconductivity, Research review 1998, ed. W. Y. Liang, 135–141), Inconel®, etc. A buffer layer is deposited between the HTSC films and the substrate for influencing the texture of the deposited HTSC film and for acting as a diffusion barrier inhibiting an ion diffusion between substrate and HTSC film. The most well known HTSC film which is generally used for the present invention is $YBa_2Cu_3O_{7-\delta}$. In the case of polycrystalline substrates of the above-mentioned kind, an artificially induced alignment by ion-beam assisted deposition (IBAD)(Iijima et al., J. Appl. Phys. 7 (1993), 1905), inclined substrate deposition (ISD) (Hasegawa et al. The 1998 Internationale Workshop on Superconductivity, 73–76) of the buffer layers or rolling assisted biaxially texturing of metallic substrate (RABiTs) (Goyal et al. Appl. Phys., Lett. 69, 1795) is required to provide a well textured growth of high-$T_c$ films.

Nevertheless, no substrate material with sufficient properties has been found for long HTSC coated tapes. For example, Ni sheets exhibit a high performance when used for smaller (1×1 cm$^2$) substrates. For longer (>10 cm) substrates, the high-$T_c$ film is generally destroyed due to local oxidation of the substrate caused by oxygen diffusion through weak parts in the buffer layer. This is also true for Inconel® and, partly, for Hastelloy® substrates. Ceramic substrates are shown to be sufficient to provide high critical currents in superconducting films, but they are not flexible enough to perform winding in coils. All of the aforementioned substrates are expensive. One square meter of each of them costs at present more than 1,000 DM (about $500).

The above-mentioned draw backs preclude the use of HTSC films in numerous fields of their industrial applications in electronics, HF-technique and power engineering, where HTSC films on a single crystalline substrate are useless because of their strictly limited dimensions and insufficient mechanical flexibility.

EP 0 312 015 A2 discloses a substrate for an oxide superconductor shaped body which is formed of an Fe—Ni—Cr steel alloy, e.g. SUS-310 or SUS-410. For these substrates a barrier layer of a noble metal is positioned between the substrate and the superconductor. Therefore, the costs of a superconducting element of this kind are high.

SUMMARY OF THE INVENTION

Accordingly, it is an aspect of the present invention to provide a superconducting element of the above-mentioned kind, which provides a high critical current density and a high transition temperature and allows a reduction of production costs.

The superconducting element according to the present invention allows both an unexpected increase of the critical current densities and transition temperatures of high temperature superconducting films and a drastically reduced substrate price, at least, by a factor of 100. A reason for the improved film performance may be the optimal combination of chosen the substrate material's properties, namely its austenitic microstructure, high thermal expansion, peculiar surface structure, temperature resistance against oxidation, etc.

In a preferred embodiment of the present invention, the steel shows heat elongation of 15 to 18, preferably 17×10$^{-6}$/K between 20° and 400° C.; of 16 to 19, preferably 18×10$^{-6}$/K between 20° and 800° C.; of 17 to 20, preferably 19×10$^{-6}$/K between 20° and 1000° C.; and of 18 to 20.5, preferably 19.5×10$^{-6}$/K between 20° and 1200° C.

A preferred steel according to the present invention is known under the EURO norm designation as X15CrNiSi25-21 or as X15CrNiSi25-20 according to DIN E EN 10096 (12/95) and has Cr content in a range of 24.0 to 26.0%, a Ni content in a range of 19.0 to 22.0% and a Si content of 1.5 to 2.5%. Said steels are normally used as parts of furnaces, which are heat resistant and have a high mechanical strength. Another embodiment of the invention is a superconductor-coated tape of the stainless steel as described above. The above aspect should not be deemed as all-inclusive, but is merely an illustrative example of the myriad of aspects associated with this present invention.

BRIEF DESCRIPTION OF THE DRAWING

Reference is now made more particularly to the drawing, which illustrates the best presently known mode of carrying out the invention and wherein similar reference characters indicate the same parts throughout the views.

DETAILED DESCRIPTION

Figure 1:
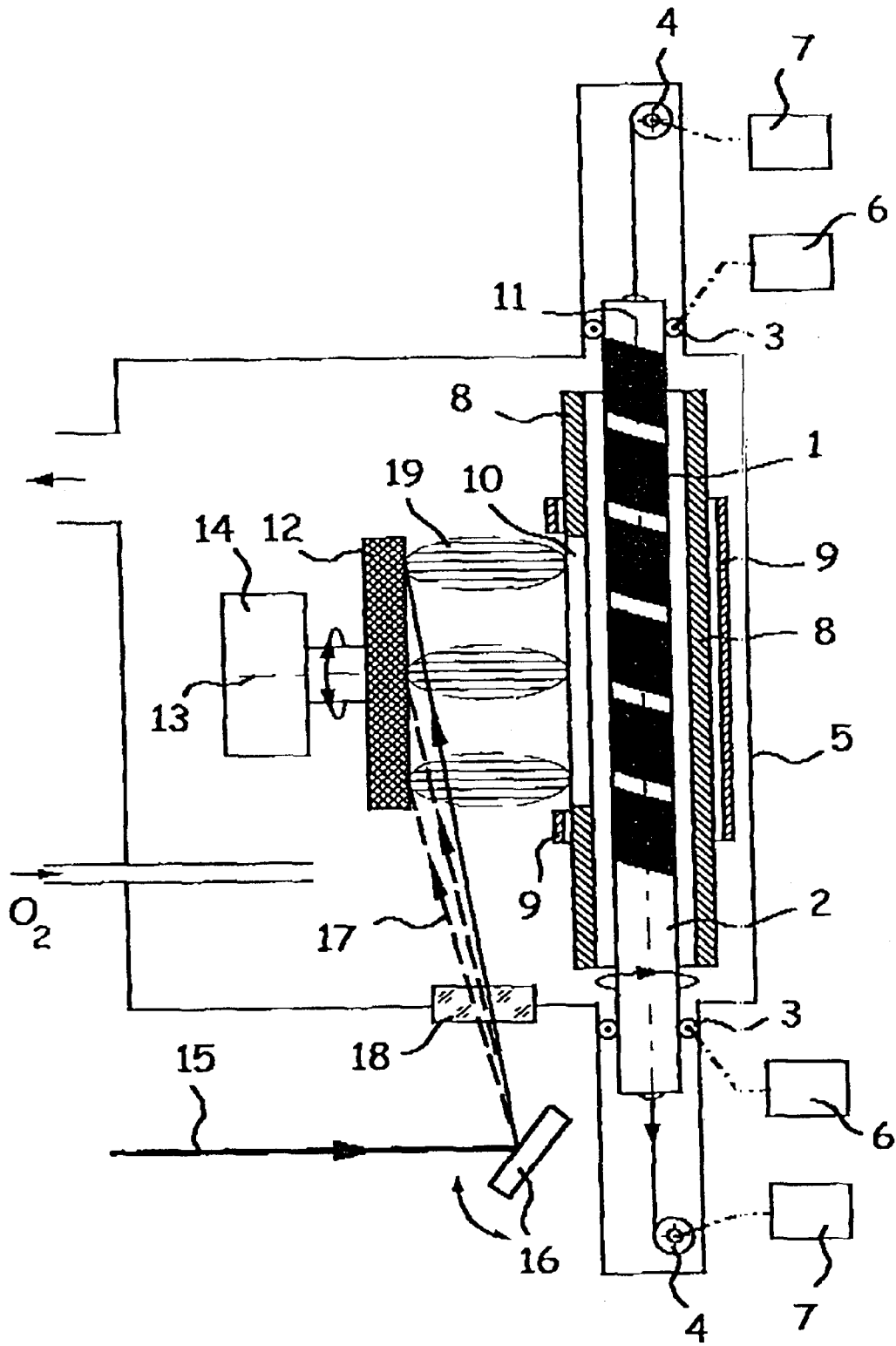
FIG. 1 is a view schematically illustrating an apparatus for preparation of HTSC films on ribbon-type substrates in accordance with an embodiment of the present invention.

In the apparatus, illustrated in FIG. 1, a foil substrate 1 consisting of stainless steel is fixed in a helix form on a cylindrical tubular holder 2 with an outer diameter of 68 millimeters and mounted together with the holder in a motion guide comprising rotating supports 3 and linear pulling devices 4 built in a vacuum chamber 5. The rotating supports 3 and the pulling devices 4 are connected to motor drives 6, 7, respectively. In a film deposition area, the substrate 1 with the holder 2 can be heated by a tubular quasi-equilibrium heater, which consists of a heating element 8 and a rotating chopper 9. The heating element 8 is provided with one deposition window 10 and the chopper 9 is equipped with three similar windows. All of the parts mentioned above are installed co-axially, relative to the rotation axis 11 of the tubular holder 2. Opposite to the deposition window 10 a ceramic target 12 is placed in the vacuum chamber 5. The target 12 is a $YBa_2Cu_3O_{7-\delta}$ composition. The target 12 is capable of linear oscillation in a direction perpendicular to the plane of the drawing of FIG. 1 and is capable also of periodic turns around an axis 13, thus providing variations of the azimuth of incoming laser beams, relative to the target. This also provides for stabilizing the laser plume during a long-term deposition process. The motions of the target 12 are provided by a two-dimensional drive 14. To provide large area pulsed laser deposition, the target 12 can be ablated by a pulsed laser beam 15 which, after a reflection at an oscillating mirror 16, is capable of scanning the target surface by a deflected beam 17 entering the vacuum chamber 5 through a window 18. An excimer laser with a wave-length of 308 nanometers, an energy of pulses of 0.5 J, and a pulse repetition rate of 300 Hz was employed as a source of the laser beam.

In operation, the chamber is pumped down to a pressure of $<10^{-3}$ mbar and the substrate 1 with the holder 2 are heated up to the temperature of 760° C. During the heating step and subsequent film deposition, the chopper 9 rotates with the frequency of 23 Hz, and holder 2 rotates with the frequency of 4 Hz. Then the oxygen pressure of 0.4 mbar is introduced into the chamber. The oscillating motions of the target 12, the mirror 16 and the axial pulling of the holder 2 are started. The laser is turned on and the laser pulses are synchronized with phases of motions of the chopper 9 and the mirror 16 so that each ablation pulse appears only at the moment when one of the deposition windows in the rotating chopper 9 coincides with the deposition window 10 in the heating element 8, i.e., when the substrate 1 is exposed to a plasma plume 19. Due to the rotation of the holder 2 and scanning of the target surface with the laser beam, a homogeneous film deposition over the substrate surface is provided. After the film deposition, the oxygen pressure in the chamber is increased up to 300 mbar within 10 minutes. Simultaneously, the substrate temperature is reduced down to 500° C. during the following 10 minutes and afterwards down to 150° C. during the next 60 minutes.

One illustrative example in accordance with the present invention is a superconducting element comprising a high temperature superconducting film deposited on a technical substrate consisting of a stainless steel which is composed of C 0 to 0.20%

Si 1.5 to 2.5%

Mn 0 to 2.00%

P 0 to 0.045%

S 0 to 0.030%

Cr 18.0 to 28.0%

Ni 16.0 to 25.0%

N 0 to 0.11% with the remainder being iron and unavoidable impurities.

The Si content is in a range between 1.6 and 2.5%, or more preferably in a range between 1.7 and 2.5%.

EXAMPLE 1

0.1 mm-thick stainless steel with a composition of Ni 19%, Cr 24%, Si 2%, Mn 1%, and with the rest of iron was used as the substrate 1. Substrate surface was galvanically polished in water solution of $H_3PO_4$ (30%), $CrO_3$ (15%) and $H_2SO_4$ (7%) using a current density of 0.5 A/cm². Polishing time was of 10 s. After the polishing the substrate 1 was thoroughly washed in de-ionized water in supersonic bath. Then the substrate was covered with an Yttrium Stabilised Zirconia 1 micrometer thick buffer layer by ion beam assisted deposition (IBAD).

By using the apparatus illustrated in FIG. 1 and described above the $YBa_2Cu_3O_{7-\delta}$ film was deposited which showed a density of the critical current in said superconducting film measured at the temperature of 77 K of 2 MA/cm². Transition temperature was 90 K. No substrate oxidation was observed after 120 min. lasting film deposition process.

The price of the substrate is 20 Duetche Marks per square meter (DM/m²), i.e. about $10 per square meter.

EXAMPLE 2

A 0.1 mm-thick stainless steel with the composition of Ni 25%, Cr 24%, Si 1.5%, Mn 2%, and with the rest of iron was used as the substrate 1. Buffer layer and superconducting film was applied as described in Example 1.

The density of the critical current in the superconducting film was of 1.8 MA/cm². Transition temperature was 90 K. No substrate oxidation was observed after 120 min.

The price of the substrate is 25 Duetche Marks per square meter (DM/m²), i.e. about $12.50 per square meter.

EXAMPLE 3

A 0.1 mm-thick stainless steel with the composition of Ni 16%, Cr 24%, Si 2%, Mn 1%, and with the rest of iron was used as the substrate 1. Buffer layer and superconducting film was applied as described in Example 1.

The density of the critical current in the superconducting film was 1.5 MA/cm². Transition temperature was 89 K. No substrate oxidation was observed after 120 min.

The price of the substrate is 20 Duetche Marks per square meter (DM/m²), i.e. about $10 per square meter.

EXAMPLE 4

A 0.1 mm-thick stainless steel with the composition of Ni 19%, Cr 18%, Si 2%, Mn 2%, and with the rest of iron was used as the substrate 1. Buffer layer and superconducting film was applied as described in Example 1.

The density of the critical current in the superconducting film was of 1.7 MA/cm². Transition temperature was 89 K. No substrate oxidation was observed after 120 min.

The price of the substrate is 18 Duetche Marks per square meter (DM/m²), i.e. about $9 per square meter.

EXAMPLE 5

A 0.1 mm-thick stainless steel with the composition of Ni 19%, Cr 28%, Si 1.5%, Mn 1%, and with the rest of iron was used as the substrate 1. Buffer layer and superconducting film was applied as described in Example 1.

The density of the critical current in the superconducting film was 1.5 MA/cm². Transition temperature was 88 K. No substrate oxidation was observed after 120 min.

The price of the substrate is 25 Duetche Marks per square meter (DM/m²), i.e. about $12.50 per square meter.

EXAMPLE 6

The stainless steel of Example 1 was used, by instead of galvanic polishing the substrate was annealed at 850° C. in vacuum during 2 hours.

The density of the critical current in the superconducting film was 1.7 MA/cm². Transition temperature was 90 K. No substrate oxidation was observed after 120 min.

The price of the substrate is 20 Duetche Marks per square meter (DM/m²), i.e. about $10 per square meter.

EXAMPLE 7

A 0.1 mm-thick stainless steel with the composition of Ni 8%, Cr 18%, Mn 2%, and with the rest of iron was used as the substrate 1. Buffer layer and superconducting film was applied as described in Example 1.

The density of the critical current in the superconducting film was 0.1 $MA/cm^2$. Transition temperature was 88 K. A pronounced substrate oxidation was observed after 120 min.

The price of the substrate is 15 Duetche Marks per square meter ($DM/m^2$), i.e. about $7.50 per square meter.

EXAMPLE 8

A 0.1 mm-thick stainless steel with the composition of Ni 9%, Cr 18%, Ti 0.5%, Mn 2%, and with the rest of iron was used as the substrate 1. Buffer layer and superconducting film was applied as described in Example 1.

The density of the critical current in the superconducting film was 0.1 $MA/cm^2$. Transition temperature was 88 K. A pronounced substrate oxidation was observed after 120 min. lasting film deposition process.

The price of the substrate is 22 Duetche Marks per square meter ($DM/m^2$), i.e. about $11 per square meter.

EXAMPLE 9

A 0.1 mm-thick stainless steel with the composition of Ni 57%, Cr 16%, Fe 6%, Mo 17%, W 5% (Hastelloy® C) was used as the substrate 1. Buffer-layer and superconducting film was applied as described in Example 1.

The density of the critical current in the superconducting film was 1.5 $MA/cm^2$. Transition temperature was 88 K. A local substrate oxidation was observed after 120 min.

The price of the substrate is 2,700 Duetche Marks per square meter ($DM/m^2$), i.e. about $1,350 per square meter.

EXAMPLE 10

A 0.1 mm-thick stainless steel with the composition of Ni 100% (Nickel) was used as the substrate 1. Buffer layer and superconducting film was applied as described in Example 1.

The density of the critical current in the superconducting film was 1.4 $MA/cm^2$. Transition temperature was 88 K. A pronounced substrate oxidation was observed after 120 min.

The price of the substrate is 1,300 Duetche Marks per square meter ($DM/m^2$), i.e. about $650 per square meter.

EXAMPLE 11

A 0.1 mm-thick stainless steel with the composition of Ni 53%, Cr 19%, Fe 19%, Mo 3%, Nb+Tb 5%, Ti 1% (Inconel®718) was used as the substrate 1. Buffer layer and superconducting film was applied as described in Example 1.

The density of the critical current in the superconducting film was 0.15 $MA/cm^2$. Transition temperature was 87 K. A local substrate oxidation was observed after 120 min.

The price of the substrate is 6,300 Duetche Marks per square meter ($DM/m^2$), i.e. about $3,150 per square meter.

EXAMPLE 12

A 0.1 mm-thick stainless steel with the composition of Ni 72%, Cr 16%, Fe 8%, Mn 1%, Si 0.5%, Co (Inconel®600) was used as the substrate. Buffer layer and superconducting film was applied as described in Example 1.

The density of the critical current in the superconducting film was 0.1 $MA/cm^2$. Transition temperature was 86 K. A large substrate oxidation was observed after 120 min.

The price of the substrate is 900 Duetche Marks per square meter ($DM/m^2$), i.e. about $450 per square meter.

EXAMPLE 13

At the same conditions as Example 1 but with a substrate composition of Ni 19%, Cr 25%, Fe 53%, Mn 2%, Si 0.75% (steel SEW No. 1.4845 or ASTM No. 310 S).

The density of the critical current in the superconducting film was 0.9 $MA/cm^2$. Transition temperature corresponds to 88 K. Some local substrate oxidation was observed after 120 mm. The price of the substrate is 614 Duetche Marks per square meter ($DM/m^2$), i.e. about $307 per square meter.

The results of the experiments according to the above examples are summarized in Table 1.

It should be noted that all indications in % are based on weight (wt %).

TABLE 1

Comparison of quality of high-Tc superconducting films and substrate prices for different metallic substrates

| No. | Substrate material | Substrate composition | | | | Substrate treatment | Quality of high-Tc film | | | Film deterioration caused by substrate oxidation |
|---|---|---|---|---|---|---|---|---|---|---|
| | | Ni | Cr | Fe | other elements | | Transition temperature | Critical current density | Price of substrate | |
| 1 | Stainless steel | 19% | 24% | ~53% | Si 2%, Mn 1% | galvanic | 90 K. | 2 $MA/cm^2$ | 20 $DM/m^2$ | no |
| 2 | Stainless steel | 25% | 24% | ~47% | Si 1.5%, Mn 2% | galvanic | 90 K. | 1.8 $MA/cm^2$ | 25 $DM/m^2$ | no |
| 3 | Stainless steel | 16% | 24% | ~56% | Si 2%, Mn 1% | galvanic | 89 K. | 1.5 $MA/cm^2$ | 20 $DM/m^2$ | no |
| 4 | Stainless steel | 19% | 18% | ~58% | Si 2%, Mn 2% | galvanic | 89 K. | 1.7 $MA/cm^2$ | 18 $DM/m^2$ | no |
| 5 | Stainless steel | 19% | 28% | ~50% | Si 1.5%, Mn 1% | galvanic | 88 K. | 1.5 $MA/cm^2$ | 25 $DM/m^2$ | no |
| 6 | Stainless steel | 19% | 24% | ~53% | Si 2%, Mn 1% | thermal | 90 K. | 1.7 $MA/cm^2$ | 20 $DM/m^2$ | no |
| 7 | Stainless steel | 8% | 18% | ~71% | Mn 2% | galvanic | 87 K. | 0.1 $MA/cm^2$ | 15 $DM/m^2$ | large |
| 8 | Stainless steel | 9% | 18% | ~70% | Ti 0.5%, Mn 2% | galvanic | 86 K. | <0.1 $MA/cm^2$ | 22 $DM/m^2$ | large |
| 9 | Hastelloy ® C | 57% | 16% | 6% | Mo 17%, W 5% | galvanic | 88 K. | 1.5 $MA/cm^2$ | 2700 $DM/m^2$ | local |
| 10 | Nickel | 100% | 0% | 0% | | galvanic | 88 K. | 1.4 $MA/cm^2$ | 1300 $DM/m^2$ | large |
| 11 | Inconel ® 718 | 53% | 19% | 19% | Mo 3%, Nb + Ta 5%, Ti 1% | galvanic | 87 K. | 0.15 $MA/cm^2$ | 6300 $DM/m^2$ | local |
| 12 | Inconel ® 600 | 72% | 16% | 8% | Mn 1%, Co, Si 0.5% | galvanic | 86 K. | 0.1 $MA/cm^2$ | 900 $DM/m^2$ | large |
| 13 | Stainless steel | 19% | 25% | ~53% | Si 0.75%, Mn 2% | galvanic | 88 K. | 0.9 $MA/cm^2$ | 614 $DM/m^2$ | small, local |

Table 1 shows that the stainless steel according to the present invention (according to SEW steel No. 1.4841 (corresponding to ASTM 314 or SUS-314) shows a double as high critical current density compared with the stainless steel of Example 9 having the SEW steel No. 1.4845 or ASTM 310 or SUS-310). Surprisingly the higher Si content of the steel according to the present invention has the effect of a much improved critical current density of the superconducting element.

We claim:

1. A superconducting element including a high temperature superconducting film deposited on a substrate having a buffer layer without a noble metal, wherein th deposition is formed on a substrate being a tape of more than 1 m. length of a stainless steel composed of:

C 0 to 0.20%

Si 1.5 to 2.5%

Mn 0 to 2.00%

P 0 to 0.045%

S 0 to 0.030%

Cr 18.0 to 28.0%

Ni 16.0 to 25.0%

N 0 to 0.11% rest iron and unavoidable impurities.

2. The superconducting element according to claim 1, wherein said stainless steel substrate has a heat elongation of 15 to $18 \times 10^{-6}$/K between 20° and 400° C., 16 to $19 \times 10^{-6}$/K between 20° and 800° C., 17 to $20 \times 10^{-6}$/K between 20° and 1000° C., and 18 to $20.5 \times 10^{-6}$/K between 20° and 1200° C.

3. The superconducting element according to claim 1, wherein said stainless steel substrate has a heat elongation of $17 \times 10^{-6}$/K between 20° and 400° C., $18 \times 10^{-6}$/K between 20° and 800° C., $19 \times 10^{-6}$/K between 20° and 1000° C., and $19.5 \times 10^{-6}$/K between 20° and 1200° C.

4. The superconducting element according to claim 1, wherein said high temperature superconducting film includes $YBa_2Cu_3O_{7-\delta}$.

5. The superconducting element according to claim 4, further including a buffer layer between said stainless steel substrate and said high temperature superconducting film.

6. The superconducting element according to claim 5, wherein said buffer layer is an Yttrium Stabilised Zirconia buffer layer.

7. The superconducting element according to claim 6, wherein said buffer layer has a thickness of substantially 1 $\mu$m.

8. The superconducting element according to claim 1, wherein said silicon is in a range of between 1.6 and 2.5%.

9. The superconducting element according to claim 1, wherein said silicon is in a range of between 1.7 and 2.5%.

10. The superconducting element according to claim 1, wherein said chromium is in a range of between 24.0 and 26.0%.

11. The superconducting element according to claim 1, wherein said nickel is in a range of between 19.0 and 22.0%.

* * * * *